US008799831B2

(12) United States Patent
Nehmadi et al.

(10) Patent No.: US 8,799,831 B2
(45) Date of Patent: Aug. 5, 2014

(54) INLINE DEFECT ANALYSIS FOR SAMPLING AND SPC

(75) Inventors: Youval Nehmadi, Modiin (IL); Rinat Shimshi, San Jose, CA (US); Vicky Svidenko, San Jose, CA (US); Alexander T. Schwarm, Austin, TX (US); Sundar Jawaharlal, Glen Allen, VA (US)

(73) Assignee: Applied Materials, Inc., Santa Clara, CA (US)

( * ) Notice: Subject to any disclaimer, the term of this patent is extended or adjusted under 35 U.S.C. 154(b) by 992 days.

(21) Appl. No.: 12/154,629

(22) Filed: May 22, 2008

(65) Prior Publication Data
US 2008/0295048 A1 Nov. 27, 2008

Related U.S. Application Data

(60) Provisional application No. 60/931,842, filed on May 24, 2007.

(51) Int. Cl.
*G06F 17/50* (2006.01)
(52) U.S. Cl.
USPC .......................................................... 716/52
(58) Field of Classification Search
CPC .. C06F 17/50; C06F 17/5081; C06F 17/5045; C06F 17/5068
USPC .................................................... 716/50–56
See application file for complete search history.

(56) References Cited

U.S. PATENT DOCUMENTS

| 5,822,218 | A | 10/1998 | Moosa et al. |
| 5,875,027 | A * | 2/1999 | Ishiguro et al. ............ 356/243.4 |
| 5,971,586 | A | 10/1999 | Mori |
| 6,178,539 | B1 | 1/2001 | Papadopoulou et al. |
| 6,311,139 | B1 | 10/2001 | Kuroda et al. |
| 6,317,859 | B1 | 11/2001 | Papadopoulou |
| 6,389,323 | B1 | 5/2002 | Yang et al. |
| 6,393,602 | B1 | 5/2002 | Atchison et al. |
| 6,496,958 | B1 | 12/2002 | Ott et al. |
| 6,714,885 | B1 | 3/2004 | Lee |
| 6,732,002 | B1 * | 5/2004 | Weiner et al. ................. 700/110 |
| 6,738,954 | B1 | 5/2004 | Allen et al. |
| 6,901,564 | B2 | 5/2005 | Stine et al. |
| 6,918,101 | B1 | 7/2005 | Satya et al. |
| 6,948,141 | B1 | 9/2005 | Satya et al. |
| 7,174,521 | B2 | 2/2007 | Stine et al. |
| 7,280,945 | B1 | 10/2007 | Weiner et al. |
| 7,356,800 | B2 | 4/2008 | Stine et al. |

(Continued)

OTHER PUBLICATIONS

Barberan, Sandrine , et al., "Management of Critical Areas and Defectivity Data for Yield Trend Modelingg", *1998 IEEE*, (Nov. 2, 1998), 17-25.

(Continued)

*Primary Examiner* — Vuthe Siek
*Assistant Examiner* — Aric Lin
(74) *Attorney, Agent, or Firm* — Blakely, Sokoloff, Taylor & Zafman LLP

(57) ABSTRACT

In one embodiment, an inline defect analysis method includes receiving geometric characteristics of individual defects and design data corresponding to the individual defects, determining which of the individual defects are likely to be nuisance defects using the geometric characteristics and the corresponding design data, and refraining from sampling the defects that are likely to be nuisance defects.

24 Claims, 10 Drawing Sheets

(56) References Cited

U.S. PATENT DOCUMENTS

| | | |
|---|---|---|
| 7,485,548 B2 | 2/2009 | Deshmukh et al. |
| 7,570,796 B2 | 8/2009 | Zafar et al. |
| 7,584,077 B2 | 9/2009 | Bergman Reuter et al. |
| 7,673,262 B2 | 3/2010 | Stine et al. |
| 7,694,244 B2 | 4/2010 | Chan et al. |
| 7,760,347 B2 | 7/2010 | Nehmadi et al. |
| 7,877,722 B2 | 1/2011 | Duffy et al. |
| 7,937,179 B2 | 5/2011 | Shimshi et al. |
| 7,962,864 B2 | 6/2011 | Nehmadi et al. |
| 2001/0029597 A1 | 10/2001 | Miwa |
| 2002/0143483 A1 | 10/2002 | Ono et al. |
| 2003/0204588 A1* | 10/2003 | Peebles et al. ............... 709/224 |
| 2004/0115541 A1 | 6/2004 | Yamaguchi et al. |
| 2004/0153979 A1 | 8/2004 | Chang |
| 2005/0071788 A1 | 3/2005 | Bickford et al. |
| 2005/0108669 A1 | 5/2005 | Shibuya |
| 2005/0132322 A1 | 6/2005 | Inoue |
| 2006/0190222 A1 | 8/2006 | Allen et al. |
| 2006/0190223 A1 | 8/2006 | Allen et al. |
| 2006/0203412 A1* | 9/2006 | Schillert et al. ............... 361/118 |
| 2006/0269120 A1 | 11/2006 | Nehmadi et al. |
| 2006/0277506 A1 | 12/2006 | Stine et al. |
| 2007/0052963 A1 | 3/2007 | Orbon et al. |
| 2007/0061773 A1 | 3/2007 | Ye et al. |
| 2007/0136714 A1 | 6/2007 | Cohn et al. |
| 2007/0156379 A1* | 7/2007 | Kulkarni et al. ............... 703/14 |
| 2007/0162242 A1 | 7/2007 | Singh et al. |
| 2007/0168895 A1 | 7/2007 | Ikeuchi |
| 2007/0212798 A1 | 9/2007 | Deshmukh et al. |
| 2007/0240085 A1 | 10/2007 | Bickford et al. |
| 2007/0256040 A1 | 11/2007 | Allen et al. |
| 2007/0294648 A1 | 12/2007 | Allen et al. |
| 2008/0127004 A1 | 5/2008 | Allen et al. |
| 2008/0140330 A1 | 6/2008 | Morioka et al. |
| 2008/0148216 A1 | 6/2008 | Chan et al. |
| 2008/0163140 A1 | 7/2008 | Fouquet et al. |
| 2008/0178137 A1 | 7/2008 | Papadopoulou et al. |
| 2008/0209365 A1 | 8/2008 | Riviere-Cazaux |
| 2008/0295047 A1 | 11/2008 | Nehmadi et al. |
| 2008/0295048 A1 | 11/2008 | Nehmadi et al. |
| 2009/0100386 A1 | 4/2009 | Allen et al. |
| 2009/0237104 A1 | 9/2009 | Tsuchida et al. |

OTHER PUBLICATIONS

Levasseur, Sandra, et al., "Application of a Yield Model Merging Critical Areas and Defectivity Data to Industrial Products", *1997 IEEE*, (1997), 11-18.

Allan, Gerard, "Design for Yield Interface to Slam IC Layout Editor", *PRWeb*, Jan. 9, 2004, 3 pages.

Allan, Gerard, "Standard and Custom Cell Yield and Critical Area Analysis Via the Web", *PRWeb*, Apr. 25, 2004, 2 pages.

Allan, Gerard A., "Targeted Layout Modifications for Semiconductor Yield/Reliability Enhancement", *IEEE Transactions on Semiconductor Manufacturing*, vol. 17, No. 4, Nov. 2004.

McGrath, Dylan, "Partnering Startups Claim DFM Sign-off Tool", http://eetimes.com/electronics-news/4057961/Partnering-starups-claim-DFM-sign-off-tool, Jan. 19, 2006, 2 pages.

McGrath, Dylan, "Startup Takes "first step" to Integrating Yield Analysis, Design", http://eetimes.com/electronics-news/4054176/Startup-takes-first-step-to-integrating-yield-analysis,-design, Jul. 11, 2005, 2 pages.

Rencher, Mark, et al., "GDSII Yield Signoff Methods", *EE Times, Pivotal Enterprises*, 2004, pp. 28-35.

Svidenko, Vicky, et al., "Dynamic Defect-Limited Yield Prediction by Critically Factor", *2007 International Symposium on Semiconductor Manufacturing; ISSM Paper: YE-O-157*, Oct. 15-17, 2007, 5 pages.

Allan, Gerard A., "EYES User Manual", Predictions Software Ltd., Version 1.3, Nov 18, 2002, 32 pages.

Allan, Gerard A., "PEYE-CAA User Manual", Predictions Software Ltd., Sep. 1, 2003, 17 pages.

Levasseru, Sandra et al., "Application of a Yield Model Merging Critical Areas and Defectivity Data to Industrial Products", Defect and Fault Tolerance in VLSI Systems, Proceedings, 1997 IEEE International Symposium on Oct. 1997, pp. 11-19.

* cited by examiner

INLINE DEFECT ANALYSIS FOR SAMPLING AND SPC

RELATED APPLICATION

The present application claims priority to U.S. Provisional Application Ser. No. 60/931,842, filed May 24, 2007, which is incorporated herein in its entirety.

FIELD OF THE INVENTION

The present invention relates to product yield prediction and analysis and more specifically to inline defect analysis for sampling and Statistical Process Control (SPC).

BACKGROUND OF THE INVENTION

The fabrication of integrated circuits is an extremely complex process that may involve hundreds of individual operations. The figure of merit of a semiconductor manufacturing facility is the sort yield obtained by electrically probing the completed devices on wafers. Once the front-end processing of the wafers is completed, the dies on the wafers are tested before they are sent to die preparation. Dies on the wafers which fail the testing are considered faulty and are discarded or scrapped. The sort yield is the proportion of devices on the wafer found to perform properly.

Since the fabrication of wafers take weeks in cycle time and a single processed wafer can have a value of tens of thousands of dollars, it is advantageous to detect problems early in the process in order to correct them, rather than wait to test the wafers once the front-end processing is complete. In order to minimize the at-risk product at final test, inline metrology and inspection steps, that is, steps performed in conjunction ("inline") with the fabrication process, as opposed to at the end of the process, are used to monitor wafer manufacturing throughout the fabrication sequence. Metrology and inspection technology includes defect inspection (to identify defects) and defect review (to help extract information from the identified defects to improve the design or alter the fabrication process in an effort to enhance the sort yield). The defects detected by inspection tools are referred to as 'visual defects.' Wafer test metrology equipment is used to verify that the wafers have not been damaged by previous processing steps. If the number of dies, on a wafer that measure as fails, exceeds a predetermined threshold, the wafer is scrapped rather than investing in further processing. Thus, it has been a goal in the industry to detect visual defects and to review the defects to determine the cause as early as possible.

Fabrication plants must capture a wide range of problems on "patterned" wafers (i.e., wafers having the circuit patterns imprinted on them), such as physical defects and electrical defects, which can ruin an entire wafer rather than just a die. As wafers move between processing steps, defect inspection systems identify the location of defects, such as particles, open lines, shorts between lines, or other problems, on the patterned wafers.

Using inspection systems to detect defects is only the first step in managing defectivity. Manufacturers must also be able to sample the defects to review and identify their causes quickly. The sampling of defects may be performed by defect review systems which may utilize Scanning Electron Microscopy (SEM) technology. SEM uses an electron beam to image and measure features on a semiconductor wafer at a much higher resolution than images captured by optical microscopes that may be used during defect inspection.

In many cases, inspection systems identify hundreds of defects for each wafer. However, not all of the identified defects are of equal importance to the device yield. Thus, not all of the defects warrant further review by defect review systems. Inspection equipment, especially in recent technologies—where the optical inspection is pushed to it's sensitivity limit in order to detect sub-micron sized defects—is often plagued with many false alarms or nuisance defects, as they are known, which serve to frustrate any attempts to reliably observe true defects or sources of defects. The problem with current review procedures is that defects are reviewed, regardless of whether they are nuisance defects. The result is an inefficient review process that may produce an inaccurate yield prediction.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
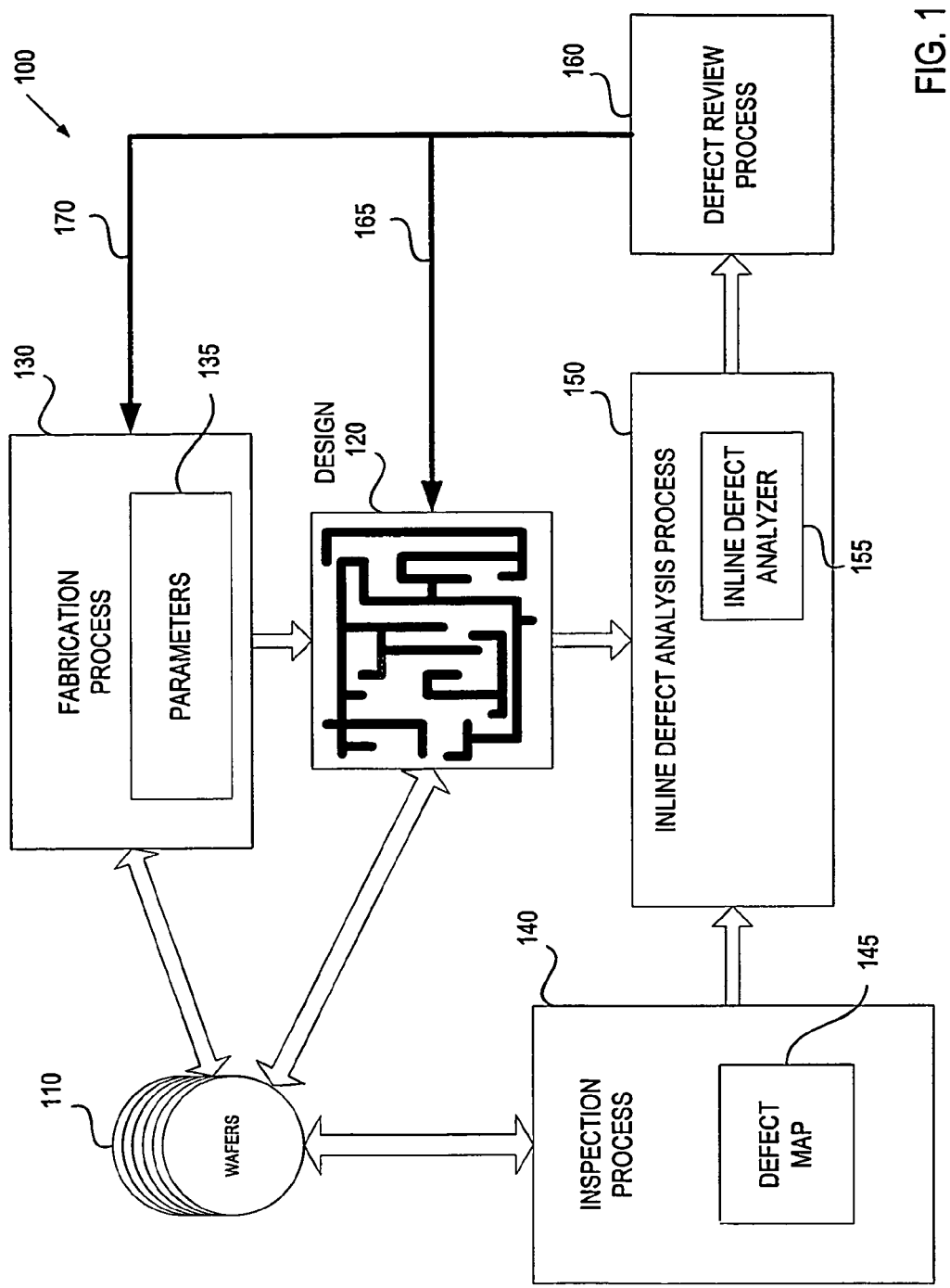
FIG. 1 illustrates an exemplary workflow for semiconductor design and fabrication, in accordance with embodiments of the present invention.

Embodiments of the invention provide a method and apparatus to perform inline defect analysis for sampling and statistical process control (SPC). Inline defect analysis for sampling and SPC will enable the use of the defect review time in a more efficient manner and focus on reviewing the defects that have a significant yield impact rather than on nuisance defects.

Not all defects identified by an inspection process are of equal importance to the device sort yield. Defects can be characterized and prioritized for defect review as nuisance defects, regular defects, and critical defects based on their impact on the yield. Nuisance defects are either true defects which have little or no impact on the yield or falsely reported defects which are an artifact of the sensitive inspection. In other words, nuisance defects do not kill a device and therefore, they would not cause a fabricated wafer to be scrapped. Defect review of nuisance defects to determine the cause of the nuisance defects is not warranted and can be eliminated from the defect review process altogether. Whereas, regular defects are defects that may affect the yield and critical defects, i.e., defects likely to kill a device, can significantly impact yield. Defect review of regular defects and critical defects to determine the causes of such defects is of high, if not the highest, priority.

Not only may defects be characterized by their impact on the sort yield, defects may also be characterized as random defects or systematic defects. Some types of random defects and systematic defects are nuisance defects and thus, do not warrant defect review. For example, some defect inspections take place in an area of the fabrication facility that does not always provide a clean environment and consequently, produces loose surface particles, loose fibers, and microscopic particles. These loose particles and fibers may contaminate a wafer resulting in a random defect. If the random defect is located in close proximity to a wafer pattern, the contamination of the wafer may significantly affect the functionality of a design and thus, impact the yield. However, the random defect may nonetheless have an insignificant effect on the yield if the defect size is small relative to the pattern density in the region where it occurred. If the wafer is contaminated in an area where no wafer pattern exists, the random defect may have no affect on the functionality of a design and thus, no impact on the yield. Such random defects that have little or no impact on the yield may be labeled nuisance defects which would not warrant further defect review.

Some systematic defects may also be nuisance defects. Systematic defects are defects due to non-random errors that are conditioned by the specifics of a design layout or the equipment. For example, systematic defects, unlike random defects, may appear repeatedly in the same device structure. A device structure is an individual logic cell or larger block that performs a specific electrical function. During fabrication, a lithography system may form the desired structures on a wafer. Some systematic defects do not affect the functionality of a design. For example, systematic defects located on a CMP dummy structure do not affect the functionality of a design. CMP (chemical-mechanical planarization or chemical-mechanical polishing) is a technique used in wafer processing for planarizing the top surface of an in-process wafer. CMP uses abrasive and corrosive chemical slurry in conjunction with a polishing pad to remove material and even out any irregular topography, making the wafer flat or planar. However, there are some structures designed and formed on a wafer, not for a specific electrical function, but as a means to avoid over-polishing during CMP. Such structures are known as CMP "dummy" structures since they have no affect on the functionality of a design. Dummy structures, for example, in the form of 1×1 micron squares, may be distributed throughout a wafer design to increase the pattern density in large open areas as a solution to avoid over polishing. Thus, defects detected on or near CMP dummy structures may result in a high frequency of occurrence. However, since CMP dummy structures have no affect on the functionality of the design, the high frequency in detecting these defects would have no affect the device yield.

Another example of systematic nuisance defects are false defects that are artifacts of the inspection originating in interactions between the light source and particular layout segments on the wafer (such as boundary regions between dense array and random logic areas). By ignoring nuisance defects, a fabrication plant is able to focus on the defects with the higher yield loss impact, such as critical defects, and thereby, avoid false alarms sent to defect review.

Some portions of the detailed description which follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing", "computing", "calculating", "determining", "displaying" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes a machine readable storage medium (e.g., read only memory ("ROM"), random access memory ("RAM"), magnetic disk storage media, optical storage media, flash memory devices, etc.), a machine readable transmission medium (electrical, optical, acoustical or other form of propagated signals (e.g., carrier waves, infrared signals, digital signals, etc.)), etc.

FIG. 1 illustrates an exemplary workflow for semiconductor design and fabrication, in accordance with embodiments of the present invention. As illustrated, wafers 110 may be produced in accordance with a design 120, via a fabrication process 130 controlled by a set of process parameters 135. These process parameters may include a wide variety of parameters, for example, lithography parameters, etch parameters, and any other type of parameters.

Due to a variety of factors, the structures formed (e.g., in separate dice) in the wafers 110 may not exactly match the design 120. To determine how the actual wafers 110 vary from the design 120, one or more of the wafers 110 undergo an inspection process 140. The inspection process 140 may be performed using any suitable type defect inspection system, such as a Dark Field, Bright Field or E-Beam inspection system. An example of a Bright Field inspection system is the UVision® inspection system available from Applied Materials® of Santa Clara, Calif. While shown as a separate process in FIG. 1, the inspection process 140 may, in some cases, be performed inline with the fabrication process 130.

As part of the inspection process 140, a defect map 145 identifying locations of defects in the wafers 110 may be generated. The defects indicated in the map 145 may be, for example, locations of elements (e.g., lines, holes/vias) formed in the wafers 110 where critical dimensions (CD) are outside a specified range. As illustrated, inspection results (e.g., captured in the defect map) may be correlated with the design 120 via an inline defect analysis process 150, for example, by using the defect map 145 and a computer automated design (CAD) model of the design 120, for example, in a graphics from (such as GDS, GDS-II, and the like). As a result, defects from the map 145 may be effectively located with the elements on which they occur. The inline defect analysis process 150 may include an inline defect analyzer 155 to correlate the inspection results with the design. By correlating the design 120 to defect data from the inspection process 140, the inline defect analyzer 155 can identify a subset of defects to be sampled by an automated defect review process 160.

As illustrated, embodiments of the present invention may provide an automated defect review process 160. The automated defect review process 160 may process a relatively large amount of defect data in an effort to extract information that may be used to gain insight into design process interaction (DPI), that is, the sensitivity of particular designs to process variations. For example, the automated defect review process 160 may extract information leading to modifications to improve the design 165 or adjusting the fabrication process to improve the process 175. Since the inspection process 140 may identify tens of thousands to hundreds of thousands of defects for the automated defect review process 160 to review, the inline defect analysis process 150 may parse the defects identified by the inspection process 140 to identify a subset of defects that warrant further investigation.

Figure 2A:
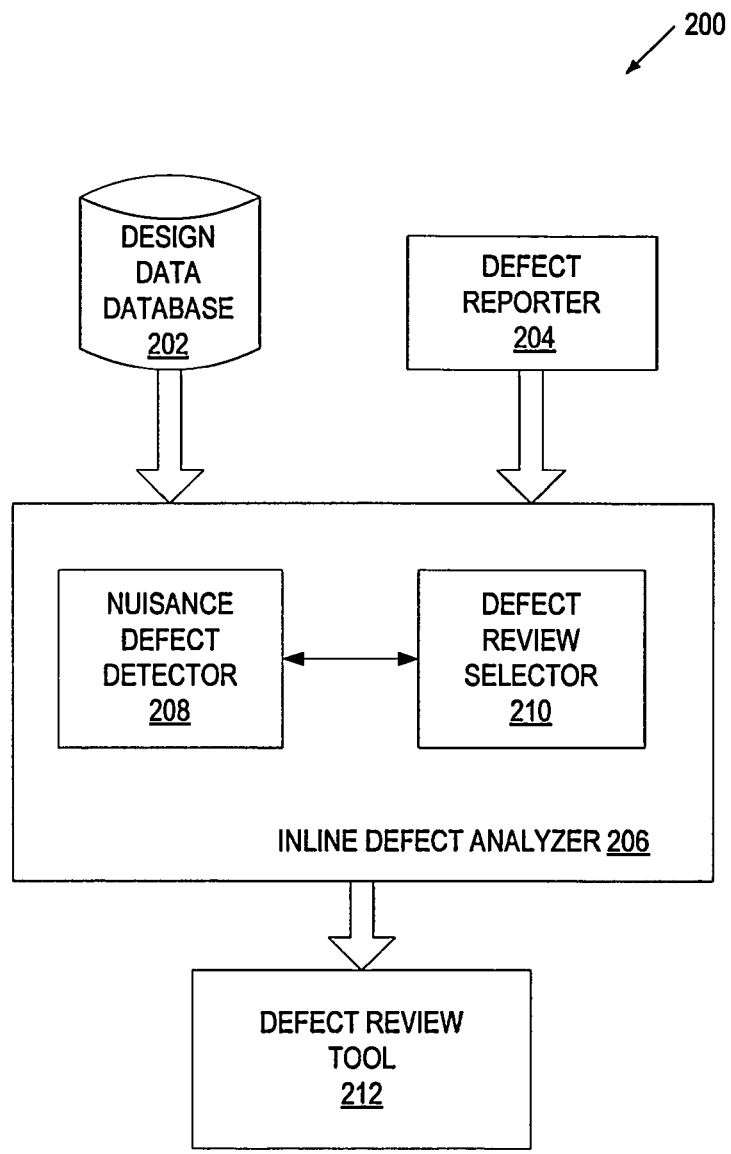
FIG. 2A is a block diagram of one embodiment of an inline defect analysis system that selects defects for sampling and Statistical Process Control (SPC)

FIG. 2A is a block diagram of one embodiment of the inline defect analysis system 200. In one embodiment, the system 200 includes a design data database 202, a defect reporter 204, an inline defect analyzer 206, and a defect review tool 212. The inline defect analyzer 206 may reside on the same computer as the design database 202, the defect reporter 204, or the defect review tool 212. Alternatively, some or the entire design database 202, the defect reporter 204, or the defect review tool 212 may reside on different machines and may communicate with the inline defect analyzer 206 via a network (e.g., a private network or a public network).

As earlier noted, a wafer may be produced according to a wafer design via a fabrication process controlled by a set of process parameters. Wafer design data may be stored in a design data database 202. The design data database 202 may store design data such as the wafer design layout, the routing information for the design layout, etc. In one embodiment, the design data may be in the form of a computer automated design (CAD) model of the design, for example, in a graphics form (such as GDS, GDS-II, and the like). The design data database 202 may also store historical design data for previously designed wafers. The inline defect analyzer 206 receives the design data from the design data database 202 to correlate the design data to defect data received from defect reporter 204.

Defect reporter 204 may be part of a defect inspection system (not shown) (e.g., a defect inspection system performing the inspection process 140 in FIG. 1). As earlier described, during the fabrication process wafers may not be formed to exactly match the design. Hence, one or more wafers undergo a defect inspection process to determine how the actual wafers vary from the design. During the inspection process, defects are identified on the wafers. Defect reporter 204 collects defect data (e.g., the geometric characteristics of individual defects) for the identified defects. The geometric characteristics may include, for example, the size of defects, the volume of defects, and the location of defects within the designs on which the defects were found, etc. In one embodiment, as part of the inspection process, a defect map identifying the locations of defects in the wafers may be generated. The defects indicated in the map may be, for example, locations of elements (e.g., lines, holes/vias) formed in the wafers where crucial dimensions are outside a specified range. In one embodiment, the defect reporter 204 may collect the geometric characteristics of the defects from the defect map. The defect reporter 204 may also store historical defect data for defects previously identified during previous wafer processing.

Figure 2B:
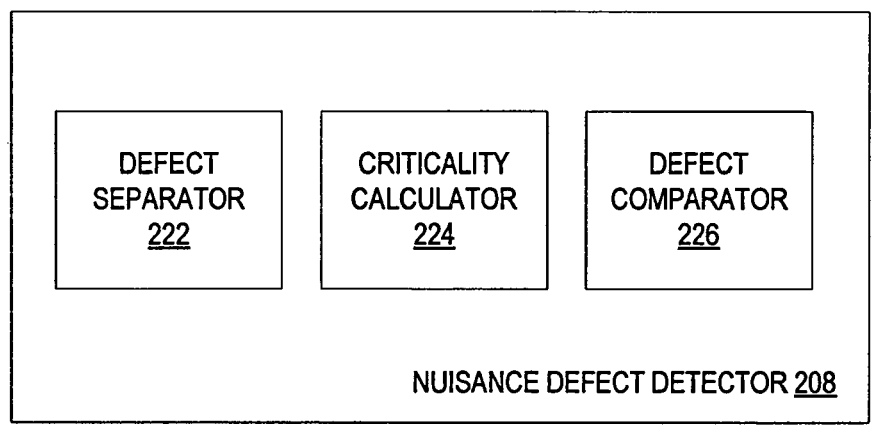
FIG. 2B is a block diagram of one embodiment of a nuisance defect detector.

The inline defect analyzer 206 may include a nuisance defect detector 208 to determine which defects are likely to be nuisance defects using the geometric characteristics of the defects from the defect reporter 204 and design data for designs on which the defects were found from the design data database 202. As illustrated in FIG. 2B, the nuisance defect detector 208 may include a defect separator 222 to separate the defects into systematic defects and random defects. The nuisance defect detector 208 may include a criticality calculator 224 to calculate a CF for the individual defects to determine which defects are nuisance defects. The nuisance defect detector 208 may include a defect comparator 226 to compare historical design data for previous designs and historical defect data for previously identified defects to determine which defects are likely to be nuisance defects.

Returning to FIG. 2A, in one embodiment, the inline defect analyzer 206 includes a defect review selector 210. The defect review selector 210 selects the defects identified as likely to be nuisance defects. In one embodiment, the defect review selector 210 compares a CF value for the individual defects to identify which defects are likely to be nuisance defects. In one embodiment, the defect review selector 210 selects defects whose design data and defect data match design data and defect data previously identified as being nuisance defects. By identifying defects as nuisance defects, the inline defect analyzer 206 may then refrain from sending the identified nuisance defects to a defect review tool 212, and instead, only send defects having a more significant effect on the device yield to the defect review tool 212 for sampling.

Defect review tool 212 samples the defects received from the inline defect analyzer 206. One example of such a defect review tool is the SEMVision™ inspection system available from Applied Materials® of Santa Clara, Calif. As discussed above, the received defects are likely to kill a device, and thus, have a significant impact on the device yield. Hence, the defect review tool 212 focuses on defects with higher yield loss impact, thus operating in a more efficient manner and providing a more accurate result.

Figure 3:
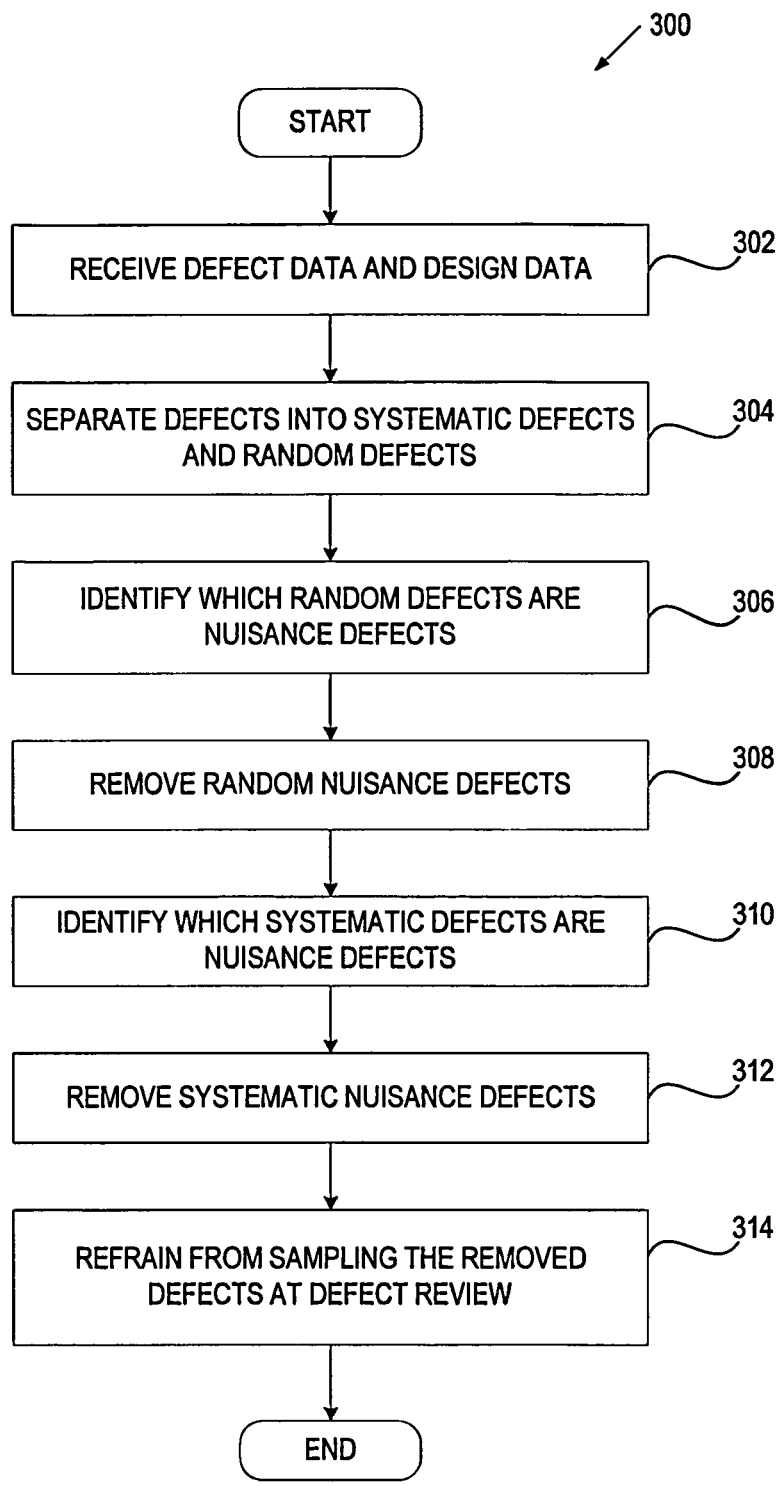
FIG. 3 is a flow diagram of one embodiment for an inline defect analysis method.

FIG. 3 is a flow diagram of one embodiment of an inline defect analysis method 300. The method may be performed by processing logic that may comprise hardware (e.g., circuitry, dedicated logic, programmable logic, microcode, etc.), software (such as instructions run on a processing device), or a combination thereof. In one embodiment, method 300 is performed by the inline defect analysis system 200 of FIG. 2A.

At block 302, geometric characteristics of individual defects is received from a defect reporter and design data for wafer designs on which these defects were found is received from a design data database. As earlier described, in one embodiment, as part of the inspection process, a defect map identifying defects in the wafers may be generated. In one embodiment, the defect map may include the geometric characteristics of the defects. The geometric characteristics may include the size of a defect, volume of a defect, and location of a defect.

The design data may include the layout of the design, placement of the active and passive elements, routing between elements, routing and element share, etc. In one embodiment, the design data may be in the form of a computer automated design (CAD) model of the design, for example, in a graphics form (such as GDS, GDS-II, and the like). Accordingly, the design data and geometric characteristics can provide the location of the defect within the design elements on which the defect is found.

At block 304 the defects are separated into systematic defects and random defects. As earlier noted, systematic defects, unlike random defects, are defects conditioned by the specifics of a design layout or the fabrication equipment and occur in specific design elements. Thus, defects are separated as systematic defects and random defects to account for the likelihood of the systematic defects occurring in specific design elements.

Systematic defects are defects strongly layout dependent and thus, they are likely occur in a very specific location (or locations) in relation to design structures. If metrology equipment has previously been trained from previous wafer fabrication that a systematic defect is a nuisance defect, this knowledge can be utilized to quickly identify whether a current systematic defect associated with the same design structures is also a nuisance defect. In such cases, systematic defects matching known systematic nuisance defects can be efficiently removed from the defect review process. Therefore, at block 304, the defects are separated into systematic defects and random defects.

Design Based Binning (DBB) may be used to separate defects as either systematic defects or random defects. In a patent application entitled "Design-Based Method for Grouping Systematic Defects in Lithography Pattern Writing System," publication number US20060269120A1, incorporated herein by reference, a method for grouping defects is described. An exemplary separation of the defects into systematic defects and random defects is illustrated in FIG. 4A and is further described below, in accordance with one embodiment of the invention.

At block 306, random defects that are nuisance defects are identified. One embodiment of a method for identifying which random defects are nuisance defects will be discussed in more detail below in conjunction with FIG. 4B. The random defects that are nuisance defects are removed at block 308. At block 314, the removed random nuisance defects are refrained from being sent to a defect review tool for sampling.

At block 310, systematic defects that are nuisance defects are identified. One embodiment of a method for identifying which systematic defects are nuisance defects will be discussed in more detail below in conjunction with FIG. 4C. The systematic defects that are nuisance defects are removed at block 312. At block 314, the removed systematic nuisance defects are refrained from being sent to a defect review tool for sampling.

Figure 4A:
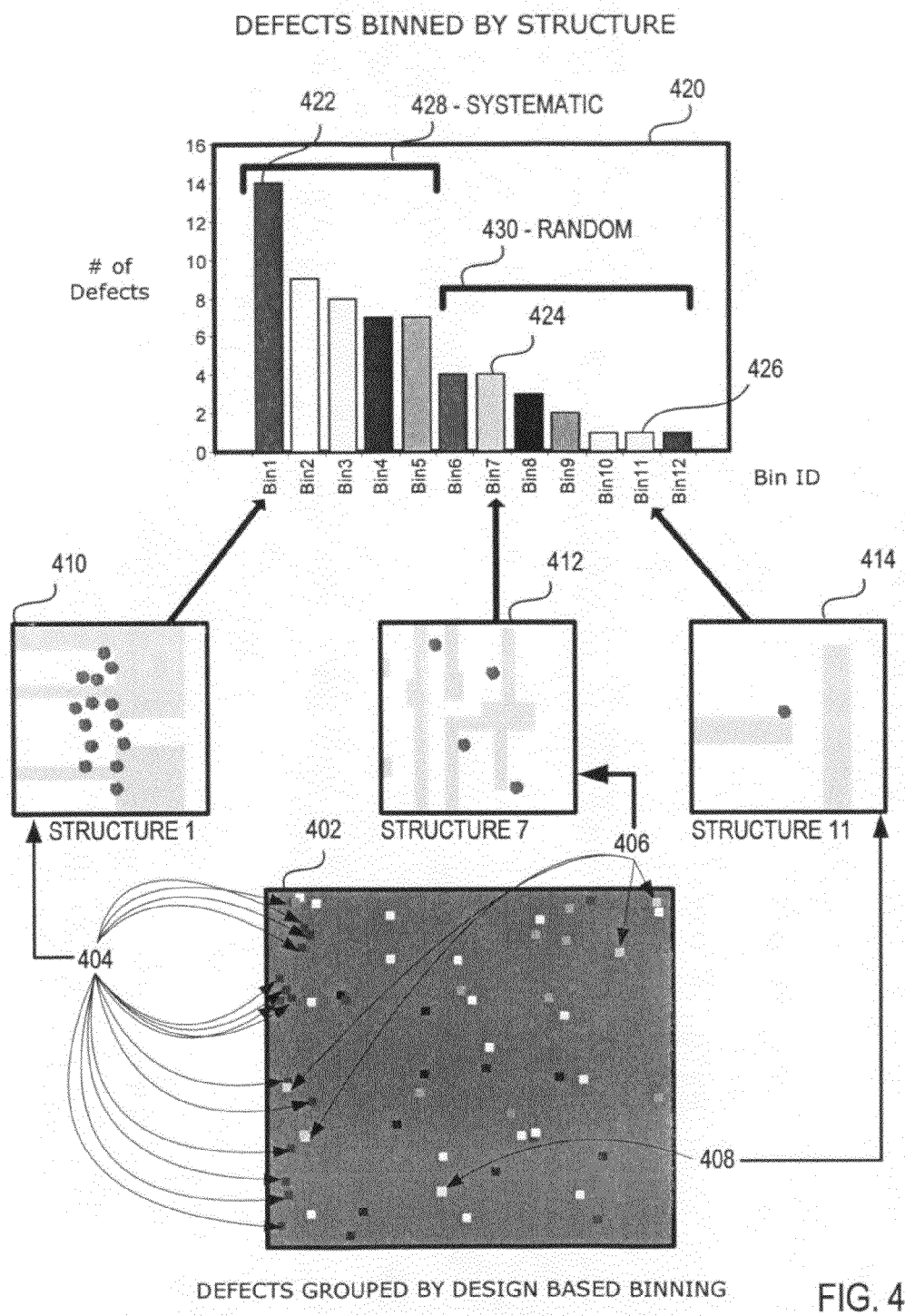
FIG. 4A illustrates grouping of defects, in accordance with one embodiment of the invention.

FIG. 4A illustrates grouping defects based on design-based binning in accordance with one embodiment of the invention. Design-based binning is the grouping of defects based on a defect's location on a wafer and relation to design elements (device structures). Binning may involve aligning a defect map and CAD model to correlate a defect's position relative to a structure in the design. As previously described, due to the repetitive nature of typical device layouts, a systematic defect mechanism will typically trigger multiple defects on various locations across a die (as well as across common location on multiple dice on a wafer). By analyzing the neighborhood (the design layout in the area surrounding the defect) of the defect, and matching it to similar defected neighborhoods in different locations across the die, defects may be categorized into design bins by common structures in which they occur. For example, area "clips" can be generated from the CAD model for the areas surrounding each defect. A clip may be a rectangle of a predetermined size centered on the defect. The clips are compared to one another to identify matching structural elements. For example, if two clips can be aligned, they are added to the same structural defect bin. By categorizing defects into structural bins, it is thus possible to track the number of defects associated with each corresponding structure.

FIG. 4A illustrates graphs depicting the number of defects in a plurality of defect bins in accordance with embodiments of the present invention. In FIG. 4A, illustration 402 is an excerpt of a mapping of defects identified by an inspection tool. As seen, three structures, Structure 1 (410), Structure 7 (412), and Structure 11 (414) are illustrated to facilitate understanding. Defects associated to similar structural elements are depicted with similar colors in illustration 402. For example, fourteen defects 404 are associated with the same structure, Structure 1 (410). Illustration 410 depicts an alignment of the clips of each of the fourteen defects associated with this structure. Structure 1 (410) is given Bin ID "Bin 1" in graph 420 and corresponds to bar graph 422. Similarly, four defects 406, associated to Structure 7, are binned together forming Bin 7, illustrated by bar graph 424 in graph 420. Illustration 412 depicts an alignment of the clips of each of the four defects assigned to Structure 7. As seen in illustration 414, one defect 408 is associated to Structure 11 (414). Bar graph 426 represents the one defect 408 assigned to Bin 11.

As seen in the low number of defects assigned to Bin 6 to Bin 12 in graph 420, random defects will generally not group. Whereas, as seen in the high number of defects assigned to Bin 1 to Bin 5, systematic defects will group. Each bin may be normalized by the occurrence of its design element in the entire layout. In one embodiment, a bin size threshold is set, above which defects can be classified as systematic defects, as illustrated by grouping 428 in graph 420. For example, this threshold can be arrived at by calculating the random probability of the given defects to land on a given structure, taking into account the prevalence of that structure in the entire design, the defect count and the die dimensions. In one embodiment, random defects are defects grouped into design-based bins smaller than the bin size threshold, as illustrating by grouping 430 in graph 420. Using this method inspection defects can be classified as random defects or systematic defects.

Figure 4B:
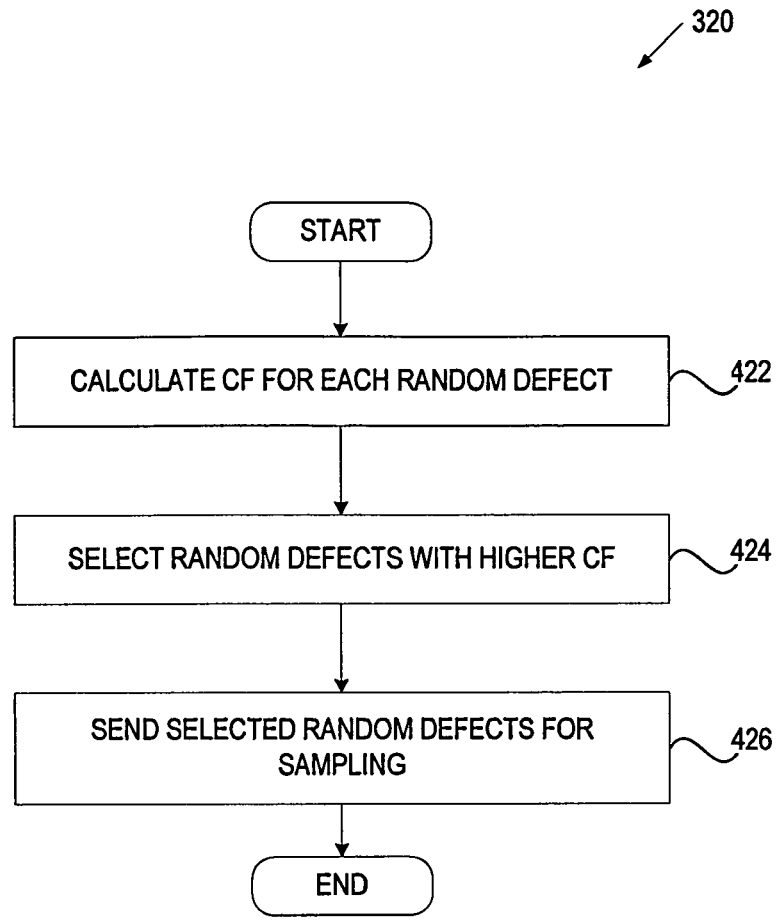
FIG. 4B is a flow diagram of one embodiment for determining which random defects are likely to be nuisance defects.

FIG. 4B is a flow diagram of one embodiment of a method 420 for determining which random defects are likely to be nuisance defects. The method may be performed by processing logic that may comprise hardware (e.g., circuitry, dedicated logic, programmable logic, microcode, etc.), software (such as instructions run on a processing device), or a combination thereof. In one embodiment, method 420 is performed by the inline defect analysis system 200 of FIG. 2A.

Some random defects may affect the functionality of a design. However, as earlier noted, a random defect may have little or no impact on the yield and conversely, a random defect may have a significant impact on yield. At block 422, a criticality factor (CF) is calculated for each random defect to help determine the impact of a random defect on the yield. In other words, a criticality factor (CF) is calculated to help identify which random defects are likely to be nuisance defects. In particular, the CF represents a probability of a random defect with a certain size or volume to kill a device. Random defects with a low probability to kill a device are nuisance defects. The CF may be calculated using the relevant design data, e.g., the layout of the relevant design on which the random defect is found and the geometric characteristics of the individual random defects, such as the size or volume of the defect. In one embodiment, a CF is calculated by determining a probability of the random defect to bridge two lines (cause a shorting failure) and a likelihood of the defect to open a line (cause an open failure). Such failures affect the functionality of a design. One embodiment of a CF calculation algorithm will be discussed in more detail below in conjunction with FIG. 5.

For example, random defects likely to bridge two lines or open a line have high CF values and are identified as critical defects. Whereas, random defects that have a low probability to cause a short failure or open failure have lower CF values and are identified as nuisance defects. At block 424, since the random defects with higher CF values are likely to affect the functionality of a design, they are selected to be sampled for review. In one embodiment, the random defects may be selected if the CF exceeds a threshold or satisfies some other requirements.

At block 426, the selected random defects are sent for sampling. By sampling random defects with higher CF values, a fabrication facility is able to focus on the defects with the higher yield loss impact.

Figure 4C:
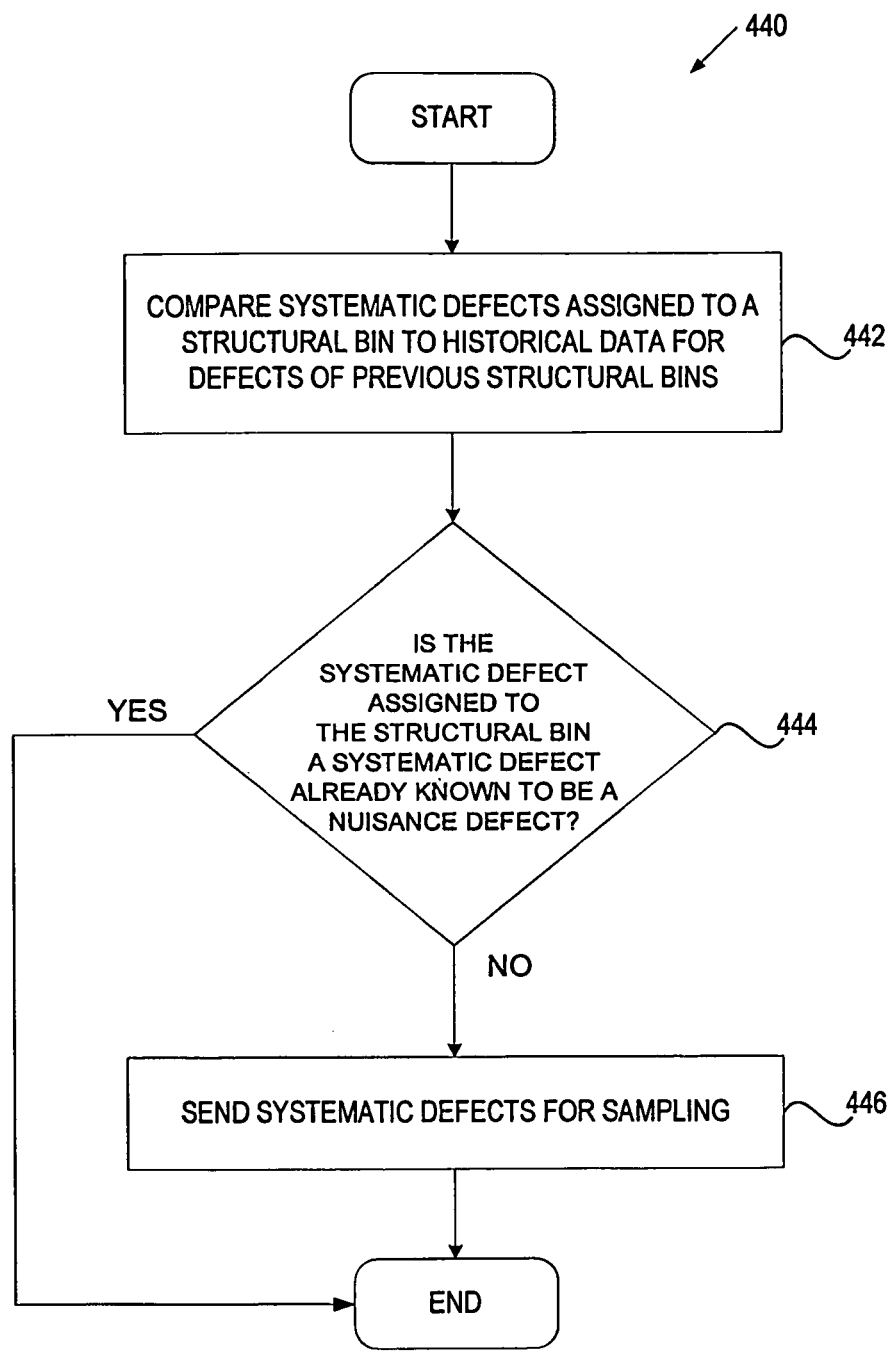
FIG. 4C is a flow diagram of one embodiment for determining which systematic defects are likely to be nuisance defects.

FIG. 4C is a flow diagram of one embodiment of a method 440 for determining which systematic defects are likely to be nuisance defects. The method may be performed by processing logic that may comprise hardware (e.g., circuitry, dedicated logic, programmable logic, microcode, etc.), software (such as instructions run on a processing device), or a combination thereof. In one embodiment, method 440 is performed by the inline defect analysis system 200 of FIG. 2A.

At block 442, systematic defects assigned to a structural bin are compared to historical data for defect previously identified by previous wafer processing and previously assigned to structural bins. Since systematic defects are due to non-random errors and are conditioned by the specifics of a design layout or the processing equipment, systematic defects are strongly dependent on the relationship between design features and process parameters. As a consequence, systematic defects will occur in a very specific location or locations. Thus, historical data for systematic defects from previous wafer designs and processing can be directly correlated to systematic defects currently undergoing wafer processing. The correlation of historical data to systematic defects identified in current wafer processing can be utilized to speed line the defect review process.

Historical data captured for the previously identified systematic defects may be stored in a design data database and a defect reporter. At decision block 444, it is determined whether the currently identified systematic defects assigned to the structural bin matches the historical data for previously identified systematic defects already known to be a nuisance defect. If the systematic defects assigned to the structural bin match the historical data for a systematic defect already known to be a nuisance defect, the systematic defects in that structural bin are not sent to the defect review tool for sampling. If the systematic defects assigned to the structural bin do not match the historical data for a systematic defect already known to be a nuisance defect, the current systematic defects in that particular structural bin are sent to the defect review tool for sampling at block 446.

By identifying nuisance defects and eliminating them from the review process, there is a lower percentage of nuisance defects during defect review, thus making defect review process more efficient.

Figure 5:
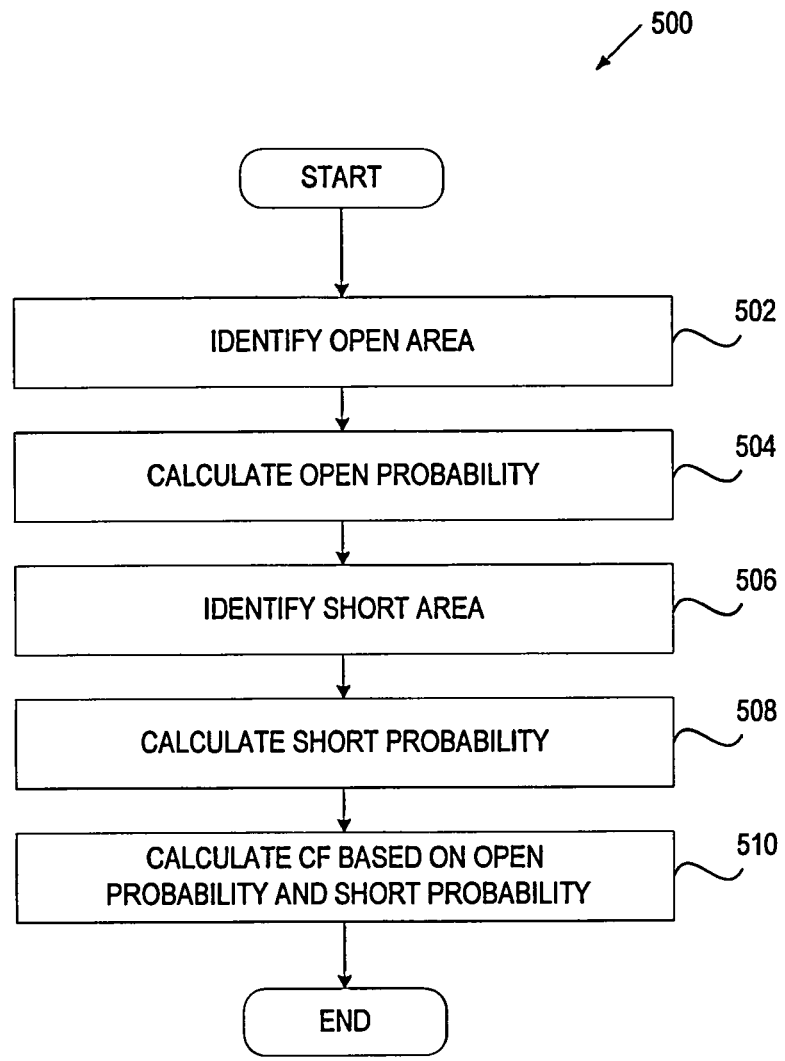
FIG. 5 is a flow diagram of one embodiment of a method for calculating a defect criticality factor (CF)

FIG. 5 is a flow diagram of one embodiment of a method 500 for calculating a defect criticality factor (CF). The method may be performed by processing logic that may comprise hardware (e.g., circuitry, dedicated logic, programmable logic, microcode, etc.), software (such as instructions run on a processing device), or a combination thereof. In one embodiment, method 500 is performed by the inline defect analysis system 200 of FIG. 2A.

In FIG. 5, an open area is identified (block 502) and a probability of the defect to cause an open failure (open probability) is calculated (block 504). The open area is the total area of all locations inside the design layout area, in which the defect would cause an opening failure. Open probability may be calculated as a ratio between the open area and the entire design layout area. In one embodiment, the design layout window may be defined the location inaccuracy of an inspection tool.

At block 506, a short area is identified. The short area is the total area of all locations inside the design layout area, in which the defect would cause a shorting failure. At block 508, a probability of the defect to cause a shorting failure (short probability) is calculated. Short probability may be calculated as a ratio between the short area and the entire design layout area.

At block 510, a CF is calculated as a kill ratio of the defect considering both open probability and short probability. For example, the CF can be calculated using the following expression:

$$Cf = 1 - (1-Ps) \times (1-Po),$$ where $Ps$ is the short probability and $Po$ is the open probability used to calculate $Cf$, the criticality factor.

Figure 6:
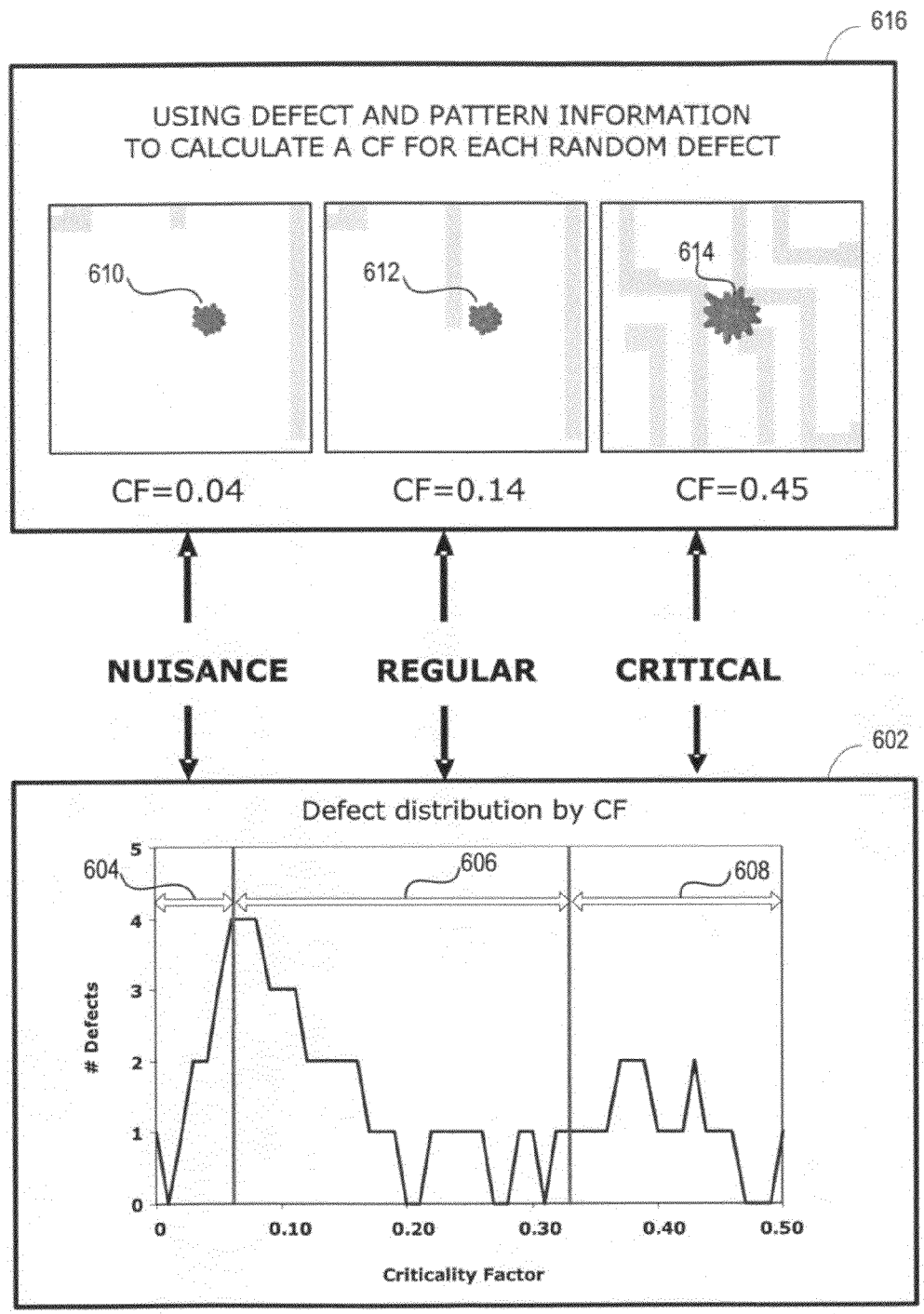
FIG. 6 illustrates calculation of an exemplary criticality factor, in accordance with one embodiment of the invention.

FIG. 6 illustrates a calculation of exemplary criticality factors, in accordance with one embodiment of the invention. As earlier noted, the defects have been separated as systematic defects and random defects to account for the fact that systematic defects are likely to occur in very specific locations. On the other hand, random defects are not dependent on design layouts and wafer processes and are unlikely to occur repeatedly in very specific locations. For the individual random defects, a CF is calculated to characterize each of the random defects as nuisance defects, regular defects, or critical defects. Graph 602 illustrates an example of a distribution of the random defects by CF.

Depending on, for example, the size of a random defect and its location relative to the design elements, a random defect may or may not affect the functionality of a design. As seen in graph 602, range 604 illustrates random defects with a low criticality factor, that is, random defects with a low probability to kill a device. Such random defects are nuisance defects.

For example, in illustration 616, random defect 610 has a low CF value of 0.04. The CF was calculated based on the geometric characteristics of the random defect, such as the size of the random defect and fault location of the random defect as may be reported by an inspection tool, and the design data, such as the routing information and design layout. For random defect 610, the CF value of 0.04 reflects that the random defect 610 is of a small size and is located in a wafer area where no wafer pattern exists. As seen, random defect 610 may have no affect on the functionality of the design and thus, is identified as a nuisance defect.

Range 606 illustrates random defects with an increased probability to affect the functionality of a design. Such random defects are regular defects. For example, in illustration 616, random defect 612 has a CF value of 0.14, which reflects that random defect 612 is of a small size and is located in close proximity to a wafer pattern. Unlike random defect 610, the close proximity of random defect 612 to a wafer pattern results a higher probability that the random defect will affect the functionality of the design, and thus, results in a much higher CF value for random defect 612 as compared to random defect 610.

Range 608 illustrates random defects with a high probability to kill a device. Such random defects are critical defects. For example, in illustration 616, random defect 614 has a high CF value of 0.45. Unlike random defect 610 and random defect 612, the high CF value for random defect 614 represents that random defect 614 is a large defect located in a wafer pattern. As seen, random defect 614 is very likely to kill the device.

Since regular defects may affect the functionality of a design and critical defects significantly affect the functionality of a design, these random regular defects and random critical defects warrant further review by the defect review tool. In one embodiment, depending on configuration, only random critical defects may be selected for sampling or both random regular and random critical defects may be selected for sampling. In such cases, these random regular and critical defects may be sent to, for example, a SEM defect review tool. Random defects with a low CF value are nuisance defects and thus, ignored by the inline defect analyzer and not submitted to the defect review tool for sampling.

Figure 7:
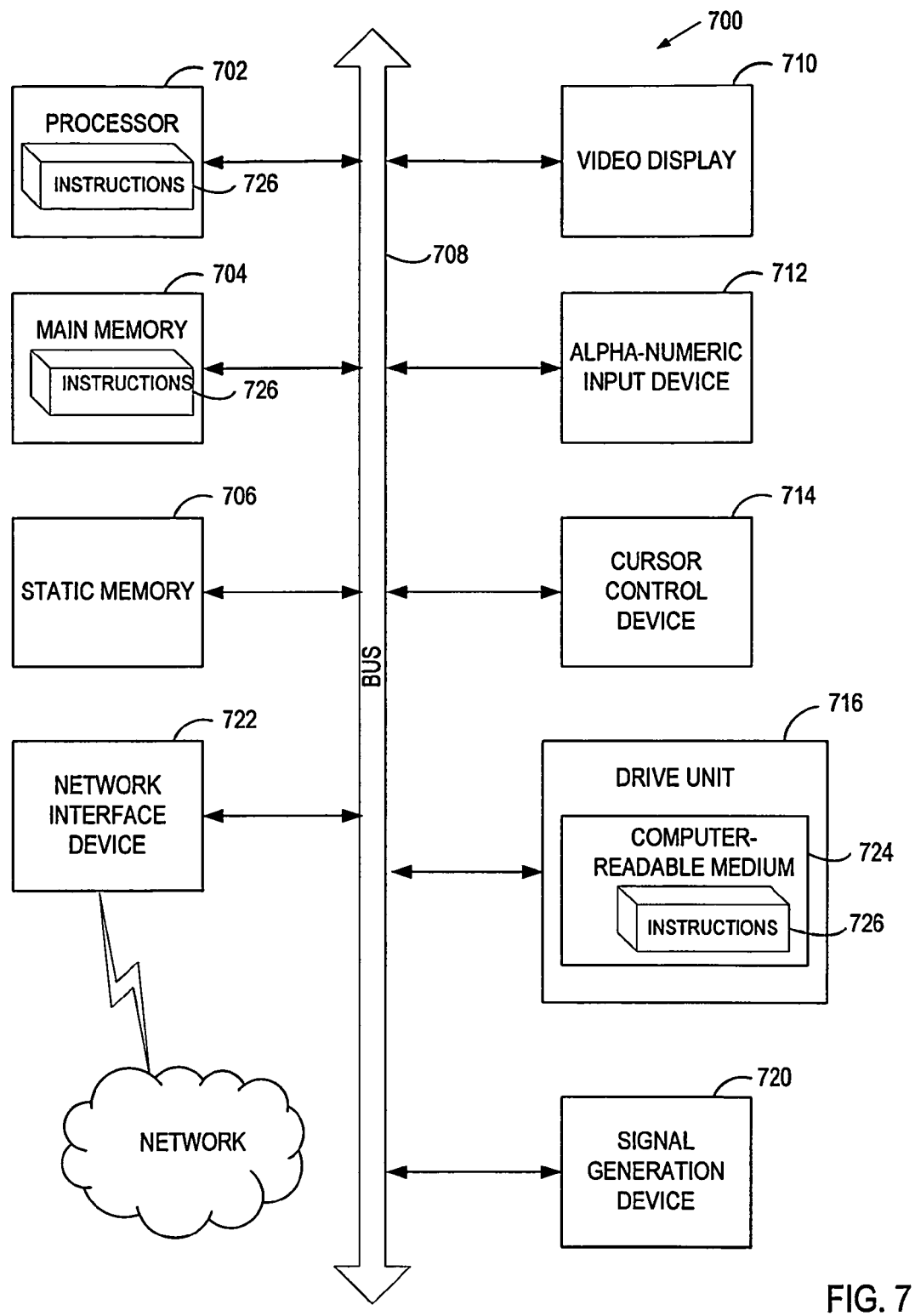
FIG. 7 illustrates an exemplary computer system.

FIG. 7 illustrates a diagrammatic representation of a machine in the exemplary form of a computer system 700 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 700 includes a processing device (processor) 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 702 may also be one or more special-purpose processing devices such as an application specific integrated circuit (ASIC), a field programmable gate array (FPGA), a digital signal processor (DSP), network processor, or the like. The processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a machine-accessible storage medium 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-accessible storage media. The software 722 may further be transmitted or received over a network 720 via the network interface device 708.

The machine-accessible storage medium 731 may also be used to store data structure sets that define user identifying states and user preferences that define user profiles. Data structure sets and user profiles may also be stored in other sections of computer system 700, such as static memory 706.

While the machine-accessible storage medium 731 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical and magnetic media, and carrier wave signals.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method comprising:
  receiving, with a system having an inline defect analyzer, geometric characteristics of individual defects and design data corresponding to the individual defects;

separating the individual defects into systematic defects and random defects;

calculating a criticality factor (CF) value for the individual random defects using the geometric characteristics and design data of the individual random defects;

refraining, with the system having the inline defect analyzer, from sampling the defects that are likely to be nuisance defects, wherein the individual defects are separated into systematic defects and random defects using design-based binning in which a bin size threshold is set for separating the systematic and random defects with the bin size threshold being based on a random probability of the individual defects to be located on a given structure.

2. The computer-implemented method of claim 1, further comprising:

determining, with the system having the inline defect analyzer, which of the individual random defects are characterized as being nuisance defects having a first range of CF values, regular defects having a second range of CF values, and critical defects having a third range of CF values using the CF values for the individual random defects and two predetermined thresholds for the CF values; and determining which systematic defects are likely to be nuisance defects, wherein the nuisance defects have a low probability of affecting a functionality of a design, the regular defects have an increased probability of affecting the functionality of the design, and the critical defects have a high probability of affecting the functionality of the design.

3. The computer-implemented method of claim 2, wherein the random defects are grouped into design-based bins that are smaller than the bin size threshold and systematic defects are grouped into designed-based bins that are larger than the bin size threshold.

4. The computer-implemented method of claim 3, further comprising:

selecting critical defects with a CF value that exceeds the at least one predefined threshold for sampling.

5. The computer-implemented method of claim 3, wherein calculating the CF value comprises:

identifying an open area, wherein the open area is a total area of all locations inside a design layout area to cause an open failure, and identifying a short area, wherein the short area is a total area of all locations inside the design layout to cause a short failure; and calculating a probability of the random defect to cause an open failure and a probability of the random defect to cause a short failure.

6. The computer-implemented method of claim 2, wherein determining which systematic defects are likely to be nuisance defects comprises:

comparing systematic defects assigned to a structural bin to historical data for defects of previous structural bins; and determining whether the systematic defects assigned to the structural bin are systematic defects already known to be nuisance defects based on the historical data.

7. The computer-implemented method of claim 1, wherein the geometric characteristics of the individual defects include a size of the individual defect, a volume of the individual defect, and a location of the individual defect within a design.

8. The computer-implemented method of claim 1, wherein the design data includes at least one of:

a layout of a design on which the defect is found and routing information for the design on which the defect is found.

9. A computer-implemented system comprising:

a design data database, to store design data for individual defects located within a design, wherein the design data includes a layout of the design on which the defect is found and routing information for the design on which the defect is found; and an inline defect analyzer, coupled to the design data database, to separate the individual defects into systematic defects and random defects; to calculate a criticality factor (CF) value for the random defects using the geometric characteristics and design data of the random defects, wherein the individual defects are separated into systematic defects and random defects using design-based binning in which a bin size threshold is set for separating the systematic and random defects with the bin size threshold being based on a random probability of the individual defects to be located on a given structure.

10. The computer-implemented system of claim 9, further comprising:

a defect reporter, to provide geometric characteristics of the individual defects, wherein the geometric characteristics include at least one of:

a size of the individual defect, a volume of the individual defect, and a location of the individual defect within a design.

11. The computer-implemented system of claim 9, further comprising:

a defect review tool, to refrain from sampling the defects likely to be nuisance defects.

12. The computer-implemented system of claim 9, wherein the inline defect analyzer comprises:

a nuisance defect detector, to determine which of the individual defects are likely to be nuisance defects; and a defect review selector, to select the defects likely to be nuisance.

13. The computer-implemented system of claim 12, wherein the nuisance defect detector determines which defects are likely to be nuisance defects by:

separating the individual defects into systematic defects and random defects;

determining which random defects are likely to be nuisance defects; and determining which systematic defects are likely to be nuisance defects.

14. The computer-implemented system of claim 13, wherein the nuisance defect detector includes a defect separator to separate the individual defects into systematic defects and random defects using design-based binning.

15. The computer-implemented system of claim 13, wherein the nuisance defect detector includes the criticality factor calculator to calculate a criticality factor (CF) value for the individual random defects using the geometric characteristics and design data of the individual random defects to determine which random defects are likely to be nuisance defects.

16. The computer-implemented system of claim 15, wherein the defect review selector selects random defects likely to be nuisance defects by comparing the CF value for the individual random defects to a predefined threshold.

17. The computer-implemented system of claim 15, wherein the criticality factor calculator calculates the CF value by:

identifying an open area, wherein the open area is a total area of all locations inside a design layout area to cause an open failure, and identifying a short area, wherein the short area is a total area of all locations inside the design layout to cause a short failure; and calculating a probability of the random defect to cause an open failure and a probability of the defect to cause a short failure.

18. The computer-implemented system of claim 13, wherein the nuisance defect detector includes a defect comparator to determine which systematic defects are likely to be nuisance defects by:

comparing systematic defects assigned to a structural bin to historical data for defects of previous structural bins; and determining whether the systematic defects assigned to the structural bin are systematic defects already known to be nuisance defects.

19. A computer-implemented apparatus comprising:

means for receiving geometric characteristics of individual defects and design data corresponding to the individual defects;

means for separating the individual defects into systematic defects and random defects;

means for calculating a criticality factor (CF) value for the individual random defects using the geometric characteristics and design data of the individual random defects;

and means for refraining from sampling the defects that are likely to be nuisance defects, wherein the individual defects are separated into systematic defects and random defects using design-based binning in which a bin size threshold is set for separating the systematic and random defects with the bin size threshold being based on a random probability of the individual defects to be located on a given structure.

20. The computer-implemented apparatus of claim 19, further comprising:

means for determining which of the individual random defects are characterized as being nuisance defects having a first range of CF values, regular defects having a second range of CF values, and critical defects having a third range of CF values using the CF values for the individual random defects and two predetermined thresholds for the CF values;

means for determining which systematic defects are likely to be nuisance defects, wherein the nuisance defects have a low probability of affecting a functionality of a design, the regular defects have an increased probability of affecting the functionality of the design, and the critical defects have a high probability of affecting the functionality of the design.

21. The computer-implemented apparatus of claim 20, wherein the means for determining which random defects are likely to be nuisance defects, regular defects, and critical defects comprises:

means for comparing the CF value for the individual random defects to at least one predefined threshold.

22. The computer-implemented apparatus of claim 20, wherein the means for determining which systematic defects are likely to be nuisance defects is by:

means for comparing systematic defects assigned to a structural bin to historical data for defects of previous structural bins; and means for determining whether the systematic defects assigned to the structural bin are systematic defects already known to be nuisance defects based on the historical data.

23. A computer readable non-transitory storage medium, comprising executable instructions which when executed on a processing system cause the processing system to perform a method comprising:

receiving geometric characteristics of individual defects and design data corresponding to the individual defects;

separating the individual defects into systematic defects and random defects;

calculating a criticality factor (CF) value for the individual random defects using the geometric characteristics and design data of the individual random defects;

and refraining, with the system having the inline defect analyzer, from sampling the defects that are likely to be nuisance defects, wherein the individual defects are separated into systematic defects and random defects using design-based binning in which a bin size threshold is set for separating the systematic and random defects with the bin size threshold being based on a random probability of the individual defects to be located on a given structure.

24. The computer readable non-transitory storage medium of claim 23, further comprising:

determining which systematic defects are likely to be nuisance defects, wherein the nuisance defects have a low probability of affecting a functionality of a design, the regular defects have an increased probability of affecting the functionality of the design, and the critical defects have a high probability of affecting the functionality of the design.

* * * * *